United States Patent [19]

Slough

[11] Patent Number: 4,599,045

[45] Date of Patent: Jul. 8, 1986

[54] SAFETY MEANS AND METHOD FOR THE HANDLING OF FLAMMABLE FLUIDS

[75] Inventor: Carlton M. Slough, Spring, Tex.

[73] Assignee: Texaco Inc., White Plains, N.Y.

[21] Appl. No.: 691,964

[22] Filed: Jan. 16, 1985

[51] Int. Cl.[4] .................. F04B 49/06; F04B 49/10; G01R 29/12

[52] U.S. Cl. ............................... 417/44; 417/1; 417/53; 324/457

[58] Field of Search ............... 417/1, 53, 44; 318/445; 324/457

[56] References Cited

U.S. PATENT DOCUMENTS

| | | | |
|---|---|---|---|
| 1,346,898 | 7/1920 | Kingsbury | 417/36 |
| 3,405,722 | 10/1968 | Carruthers et al. | 137/487.5 |
| 3,761,803 | 9/1973 | Slough | 324/457 |
| 4,120,611 | 10/1978 | Salve | 417/44 |
| 4,197,493 | 4/1980 | Juve et al. | 324/457 |
| 4,270,090 | 5/1981 | Williams | 324/457 |
| 4,489,278 | 12/1984 | Sawazaki | 324/457 |

FOREIGN PATENT DOCUMENTS 47908 8/1979 Japan ...................... 324/457

Primary Examiner—William L. Freeh
Attorney, Agent, or Firm—Robert A. Kulason; James J. O'Loughlin; Ronald G. Gillespie

[57] ABSTRACT

The present invention is an apparatus and method for use in a flammable fluid distribution facility where a tanker truck or tanker ship onloads the flammable fluid and transports it to one or more locations. The present invention includes pumps for pumping the flammable fluid into the tanker and a monitor which monitors the tanker at the distribution facility to sense the presence and the strength of an electrostatic field and providing a field signal representative of the field strength of the electrostatic field. Circuitry connected to the monitor and to the pumps stops the pumping of the flammable fluid into the tanker when the field signal from the monitor indicates an unsafe strength of the electrostatic field.

7 Claims, 4 Drawing Figures

SAFETY MEANS AND METHOD FOR THE HANDLING OF FLAMMABLE FLUIDS

BACKGROUND OF THE INVENTION

Field of the Invention

The present invention relates to safety systems in general and, more particularly, to safety systems involving the handling of flammable fluids.

SUMMARY OF THE INVENTION

The present invention is an apparatus and method for use in a flammable fluid distribution facility where a tanker truck or tanker ship onloads the flammable fluid and transports it to one or more locations. The present invention includes pumps for pumping the flammable fluid into the tanker and a monitor which monitors the tanker at the distribution facility to sense the presence and the strength of an electrostatic field and providing a field signal representative of the field strength of the electrostatic field. Circuitry connected to the monitor and to the pumps stops the pumping of the flammable fluid into the tanker when the field signal from the monitor indicates an unsafe strength of the electrostatic field.

The objects and advantages of the invention will appear more fully hereinafter from a consideration of the detailed description which follows, taken together with the accompanying drawings wherein one embodiment of the invention is illustrated by way of example. It is to be expressly understood, however, that the drawings are for illustration purposes only and are not to be construed as defining the limits of the invention.

DESCRIPTION OF THE PREFERRED EMBODIMENT

The present invention is a safety shut-off system for the loading of flammable fluid products in tanker trucks, such as the loading of gasoline at an oil company depot. The system of the present invention detects when an electrostatic field is in existence from a tanker truck ready to be loaded and shuts off the pumps so that it cannot be loaded until the electrostatic field has been safely discharged.

Figure 1:
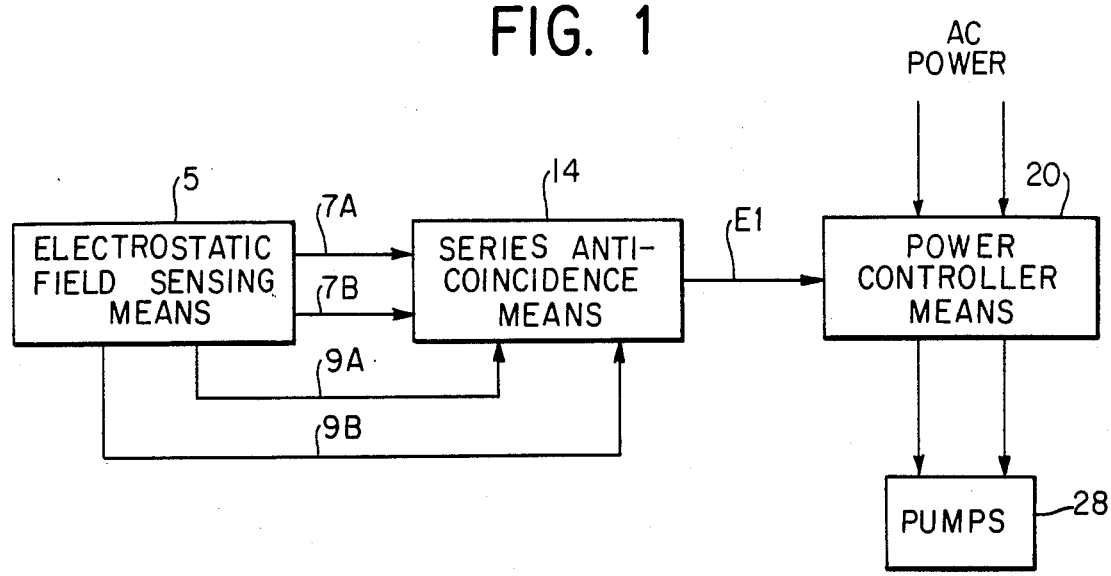
FIG. 1 is a simplified block diagram of a safety system constructed in accordance with the present invention.

With reference to FIG. 1, a field meter 5 is located at an appropriate place to detect the electrostatic field of a tanker truck. The location may be in an entrance lane for the truck approaching the pumps or it may even be right at the pumps themselves. Electrostatic field meter 5 provides two signals. One signal represented by a line 7, relates to the status of the electric field meter, that is, whether it is turned on or is off. The other signal on line 9 relates to the measured electrostatic field strength. The signals on lines 7, and 9 are provided to a series anti-coincidence means 14 which in turn provides a signal E1 to power controller means 20. Power controller means 20 receives A.C. power and will provide the A.C. power to the pumps 28 if signal E1 indicates that the electric field meter is operable and the sensed electric field is not strong enough to cause a discharge. Should either of the two events occur, that is the electric field meter is not turned on, or should the signal from electric field meter 5 indicate that the strength of the electrostatic field is above safe levels, then power controller means 20 does not provide the A.C. power to pumps 28.

Figure 2:
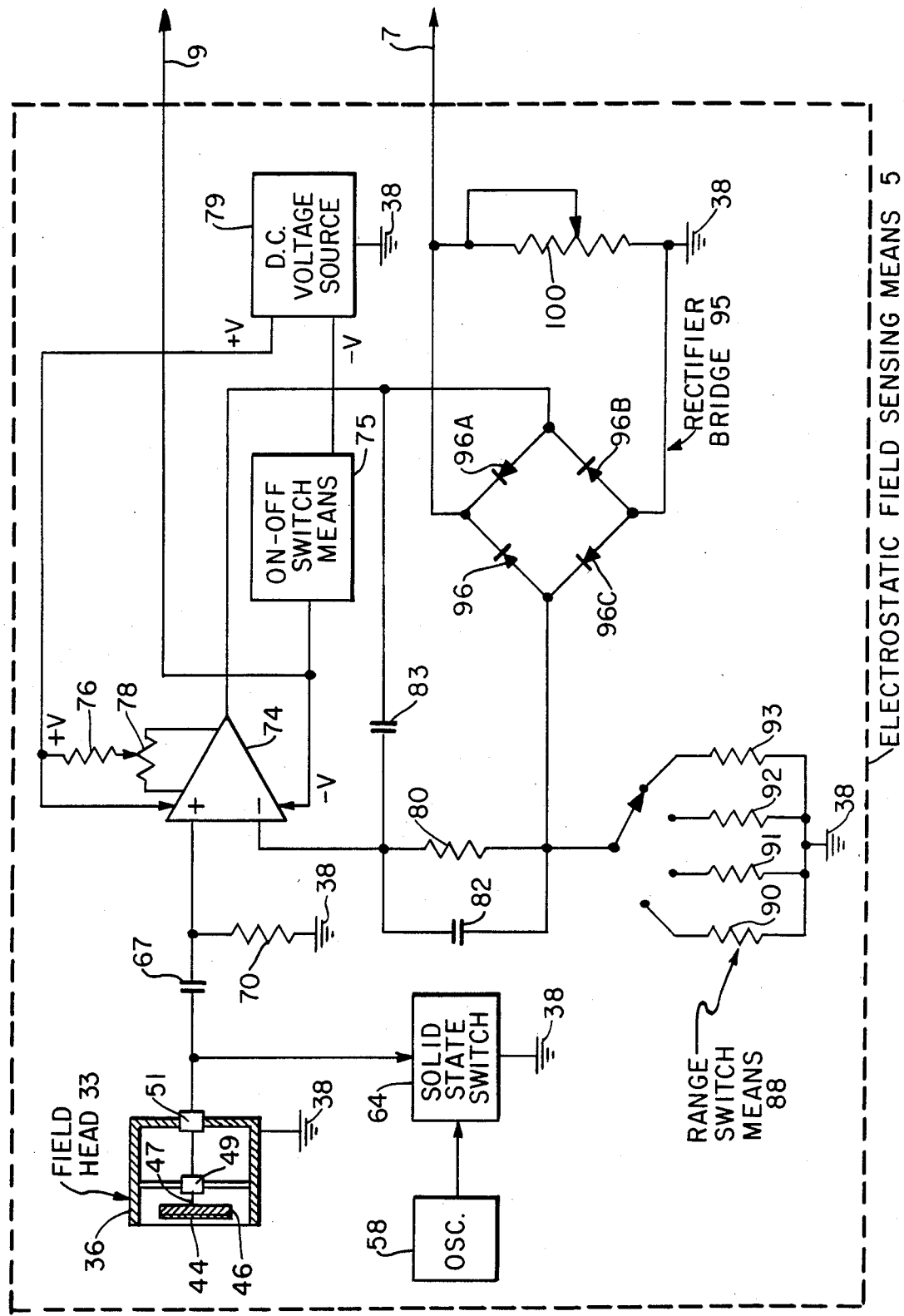
FIG. 2 is a detailed schematic of the electrostatic field sensing means shown in FIG. 1.

Referring to FIG. 2, a field head 33 includes a shield 36 made of metal and connected to a ground 38. An insulator 46 has a metalized surface 44. Because of the shielding affects of shield 36, an electrostatic field may only be sensed in the unshielded direction. When the metalized surface 44 is exposed to the electrostatic field, a charge will accumulate on surface 44. The amount of charge on surface 44 is proportional to the field strength. A conductor 47 is connected to the metalized surface 44 and passes through insulators 46, 49 and 51. Insulator 49 allows a support member 54 to be used to support insulator 46, and hence surface 44, in position while passing through conductor 47 without electrical connection to shield 36.

Insulator 51 also permits conductor 47 to pass through without electrical connection to shield 36. An oscillator 58 provides a continuous square wave voltage at a predetermined frequency to a solid state switch 64. Oscillator 58 may be of a conventional type and may provide the square wave at a 5 volt magnitude. The solid state switch 64 may actually represent a plurality of switches so as to share the current resulting from the discharge of the electrical charge on conductor 47 as hereinafter explained. Solid state switch 64 is connected to conductor 47 and to ground 38.

In operation, the square wave from oscillator 58 effectively opens and closes switch 64 on a periodic basis. When in the open state, conductor 47 builds up to the charge on the metalized surface 44 of insulator 40. When switch 64 is closed the charge on conductor 47 is discharged to ground, that is to zero. The opening and closing of switch 64 in effect creates an AC signal from the charge on surface 44 whose magnitude is the same as the magnitude of the charge on surface 44. The AC signal passes through a blocking capacitor 67 which is developed as a voltage across resistor 70. The voltage appearing at the connection of capacitor 67 and resistor 70 is applied to a "+" input of an operational amplifier 74. Operational amplifier 74 receives a +V biasing voltage from D.C. voltage source 79 which is also applied through the resistor 76 to a potentiometer 78 connected across terminals of amplifier 74. The arrangement of resistor 76 and potentiometer 78 provides adjustment for offset null.

Amplifier 74 receives a negative −V biasing from an on/off switch means 75. On-off switch means 75 receives the −V voltage from D.C. voltage source 79 which is connected to ground 38. On-off switch means 75, as its title implies, controls the status of electrostatic field sensing means 5, i.e. whether it is "on" or "off". On-off switch means 75 provides the −V voltage to line 9 A "−" input of amplifier 74 is connected to a resistor 80 and capacitors 82 and 83. Capacitor 82 is connected across resistor 80 and resistor 80 is also connected to a range switch means 88 including range resistors 90, 91, 92, 93, having a common connection to ground 38.

The output of amplifier 74 is connected to the unconnected end of capacitor 83 and to a rectifying bridge 95 including diodes 96, 96A, 96B, and 96C. The common connection of resistor 80, capacitor 82 and range switch 88 is connected to rectifier bridge 95 so that last mentioned connection and the output of amplifier 74 are in effect connected to the inputs of rectifier bridge 95. The outputs of rectifier bridge 95 are connected across a potentiometer 100 and to line 7 and to ground 38.

Thus in operation the signal that passes through capacitor 67 is amplified by amplifier 74 and is subsequently rectified by rectifier bridge 95 and resistor 80 and capacitor 82 to provide a rectified signal to lines 7. Ranges may be selected by use of range switch means 88 which changes the value of resistance connected between the "−" terminal of amplifier 74 and ground 38 so as to affect the amplitude of the output signal provided by amplifier 74.

Figure 3:
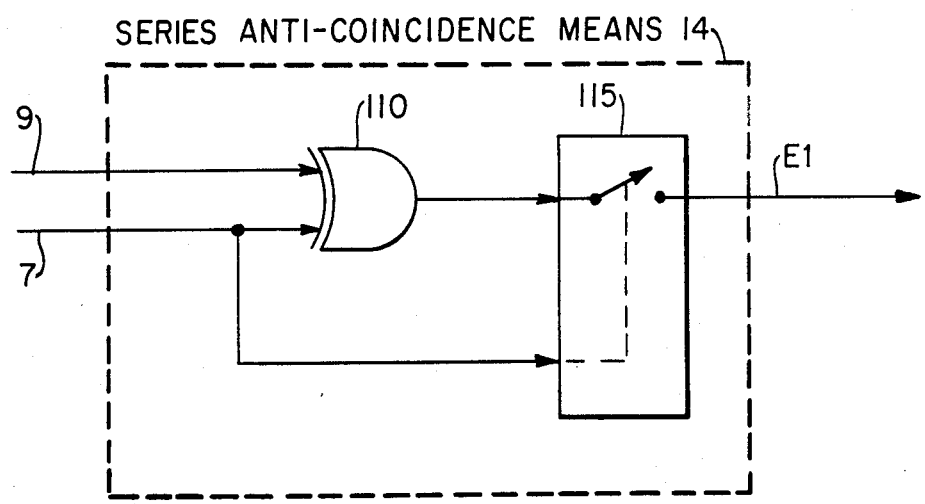
FIG. 3 is a detailed schematic of the series anti-coincidence means shown in FIG. 1.

With reference to FIG. 3, series anti-coincidence means 14 includes an exclusive OR gate 110 receiving the −V voltage on line 9 and the output from rectifier bridge 95 on line 7. The output from exclusive OR gate 110 is provided to an electronic switch 115, which may be of the type manufactured by Signetics as their part number DGM 111. The signal on line 7 is also provided to electronic switch 115 to control its switching operation.

The operation of series anti-coincidence means 14 is such that when the signal on line 7 is of sufficient amplitude due to the presence of an electrostatic field, and the electrostatic field sensing means 5 is in an "on" condition, the output of exclusive OR gate output, and hence signal E1, goes to a low logic level causing pumps 28 to be shut off. When sensing means 5 is in an "on" condition but the electrostatic field is either non-existent or its strength is weak, exclusive OR gate 110 provides a high logic level signal which is provided by electronic switch 115 as signal E1. Signal E1, when at a high logic level, causes pumps 28 to be operational.

When the status of electrostatic field sensing means 5 is "off", the absence of the D.C. voltage on line 9 causes electronic switch 115 to open. Signal E1 is provided as a low logic level signal whenever electronic switch 115 is in an open condition. The low logic level signal E1 causes pumps 28 to be turned off.

The present invention is a system which protects a flammable liquid loading station from explosion brought about by the discharge of elecrostatic fields to the loading of tanker trucks. It should be noted that the present invention is not restricted to the safety involving tanker trucks but is also applicable to tanker ships or if the trucks and ships off-load, a similar safety may be used.

Figure 4:
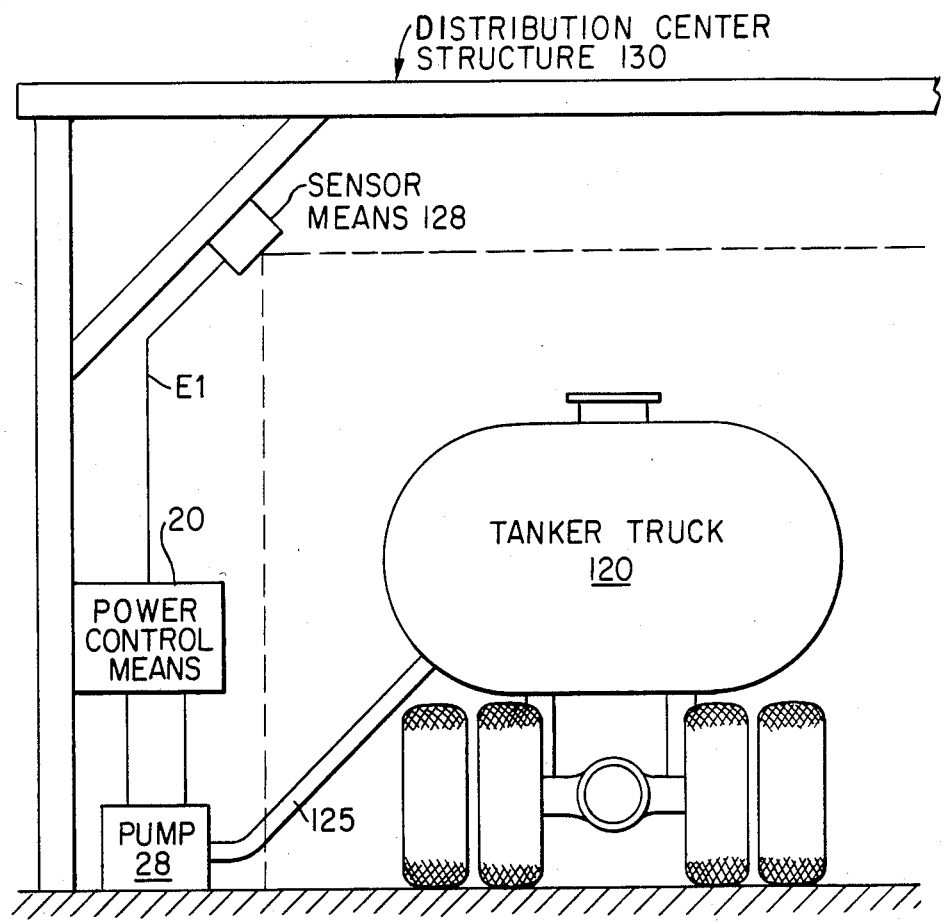
FIG. 4 is a pictorial representation of a use of the present invention, shown in FIGS. 1, 2 and 3, in the loading of a tanker truck at a petroleum product distribution center.

In regards to the use of the present invention involving tanker trucks and with reference to FIG. 4, there is shown a tanker truck 120 being filled at a distribution center. Pump 28 pumps the petroleum product through a line 125 into truck 120. Electrostatic field sensing means 5 and series anti-coincidence means 14 are housed together in sensor means 128 which is attached to a structure 130 of the distribution center. Thus field sensing means 5 senses the electrostatic field of tank truck 120 as it approaches the pumps and while it is at the pumps. As explained hereinbefore, if a dangerous electrostatic field existed on tanker truck 120, or if it develops while filling tanker truck 120, pump 28 is disabled so that no petroleum product can be pumped into tanker truck 120.

What is claimed is:

1. Apparatus for use in a flammable fluid distribution facility where tanker means load flammable fluid and transport it to one or more locations, comprising:
   pump means for pumping the flammable fluid into the tanker means,
   monitor means located outside of the tanker means for monitoring the tanker means at the distribution facility to sense a presence and a strength of an electrostatic field associated with the tanker means and providing a field signal representative of the field strength of the electrostatic field, and
   control means connected to the monitor means and to the pump means for controlling the pumping of the flammable fluid into the tanker means in accordance with the field signal from the monitor means so as to prevent pumping of the flammable fluid when the field signal is indicative of an unsafe electrostatic field strength.

2. Apparatus as described in claim 1 in which the monitor means also provides a status signal representative of whether the monitor means is operational or non-operational and the control means controls the pump means in accordance with the field signal and the status signal.

3. Apparatus as described in claim 2 in which the control means includes anti-coincidence means connected to the monitor means for providing a signal representative of a safe condition for operation of the pump means in accordance with the field signal and the status signal, and
   power means for providing AC power to the pump means in response to a signal from the anti-coincidence means rendering the pump means operational and for not providing the AC power to the pump means so as to render the pump means inoperative when the anti-coincidence means does not provide a signal.

4. Apparatus as described in claim 3 in which the anti-coincidence means includes
   exclusive OR gate means receiving the field signal and the status signal for providing a signal when the field signal indicates the nonexistence of an electrostatic field or the existence of a very weak electrostatic field and the status signal indicates that the monitor means is operational and for providing no signal when the status signal indicates the monitor means is operational and the field signal indicates the presence of an unsafe electrostatic field, and
   electronic switching means connected to the monitor means the excluisve OR gate means for either passing the signal from the exclusive OR gate means to the power means or for blocking the signal from the exclusive OR gate means in accordance with the status signal.

5. A method for use in a flammable fluid distribution facility where tanker means load flammable fluid and transport it to one or more locations, comprising the steps of:
   monitoring the tanker means from outside of the tanker means at the distribution facility with monitor means to sense a presence and a strength of an electrostatic field associated with the tanker means,
   providing a field signal representative of the field strength of the monitored electrostatic field, and
   controlling the loading of the flammable fluid into the tanker means in accordance with the field signal so as to prevent loading of the flammable fluid when the field signal is indicative of an unsafe electrostatic field strength.

6. A method as described in claim 5 further comprising the step of providing a status signal representative of whether the monitor means is operational or non-operational and the controlling step controls the loading of the tanker means in accordance with the field signal and the status signal.

7. A method as described in claim 6 in which the controlling includes providing a safe condition signal representative of a safe condition for loading of the tanker means in accordance with the field signal and the status signal, and loading the tanker means with the flammable fluid in response to the safe condition signal and for not loading the tanker means when a safe condition signal is not provided.

* * * * *